(12) United States Patent
Chiu et al.

(10) Patent No.: US 11,101,385 B2
(45) Date of Patent: Aug. 24, 2021

(54) FIN FIELD EFFECT TRANSISTOR (FINFET) DEVICE STRUCTURE WITH AIR GAP AND METHOD FOR FORMING THE SAME

(71) Applicant: Taiwan Semiconductor Manufacturing Co., Ltd., Hsinchu (TW)

(72) Inventors: Wen-Li Chiu, Kaohsiung (TW); Hsin-Che Chiang, Taipei (TW); Chun-Sheng Liang, Puyan Township, Changhua County (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 17 days.

(21) Appl. No.: 16/135,108

(22) Filed: Sep. 19, 2018

(65) Prior Publication Data

US 2020/0091345 A1 Mar. 19, 2020

(51) Int. Cl.
*H01L 29/66* (2006.01)
*H01L 21/768* (2006.01)
(Continued)

(52) U.S. Cl.
CPC ...... *H01L 29/7851* (2013.01); *H01L 21/0337* (2013.01); *H01L 21/76829* (2013.01); *H01L 21/823418* (2013.01); *H01L 21/823431* (2013.01); *H01L 21/823468* (2013.01); *H01L 29/0649* (2013.01); *H01L 29/66545* (2013.01); *H01L 29/66795* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/02–365; H01L 29/16–1608; H01L 29/18–185; H01L 29/22–2206
See application file for complete search history.

(56) References Cited

U.S. PATENT DOCUMENTS 8,772,109 B2 7/2014 Colinge
8,785,285 B2 7/2014 Tsai et al.
(Continued)

*Primary Examiner* — Khaja Ahmad
*Assistant Examiner* — Khatib A Rahman
(74) *Attorney, Agent, or Firm* — McClure, Qualey & Rodack, LLP

(57) ABSTRACT

A method for forming a FinFET device structure is provided. The method for forming a FinFET device structure includes forming a fin structure over a substrate and forming a gate structure across the fin structure. The method for forming a FinFET device structure also includes forming a first spacer over a sidewall of the gate structure and forming a second spacer over the first spacer. The method for forming a FinFET device structure further includes etching the second spacer to form a gap and forming a mask layer over the gate structure and the first spacer after the gap is formed. In addition, the mask layer extends into the gap in such a way that the mask layer and the fin structure are separated by an air gap in the gap.

20 Claims, 14 Drawing Sheets

(51) Int. Cl.
*H01L 29/78* (2006.01)
*H01L 29/06* (2006.01)
*H01L 21/8234* (2006.01)
*H01L 21/033* (2006.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,536,982 B1* | 1/2017 | Cheng | H01L 29/42376 |
| 9,576,814 B2 | 2/2017 | Wu et al. | |
| 10,008,578 B1* | 6/2018 | Lee | H01L 29/4991 |
| 2013/0248950 A1* | 9/2013 | Kang | H01L 29/4991 |
| | | | 257/288 |
| 2014/0264480 A1* | 9/2014 | Tsao | H01L 21/76834 |
| | | | 257/288 |
| 2017/0179241 A1* | 6/2017 | Chang | H01L 21/31111 |
| 2018/0090593 A1* | 3/2018 | Cheng | H01L 29/4991 |
| 2019/0172752 A1* | 6/2019 | Hsu | H01L 29/66795 |
| 2019/0393335 A1* | 12/2019 | Economikos | H01L 29/6681 |

* cited by examiner

FIN FIELD EFFECT TRANSISTOR (FINFET) DEVICE STRUCTURE WITH AIR GAP AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
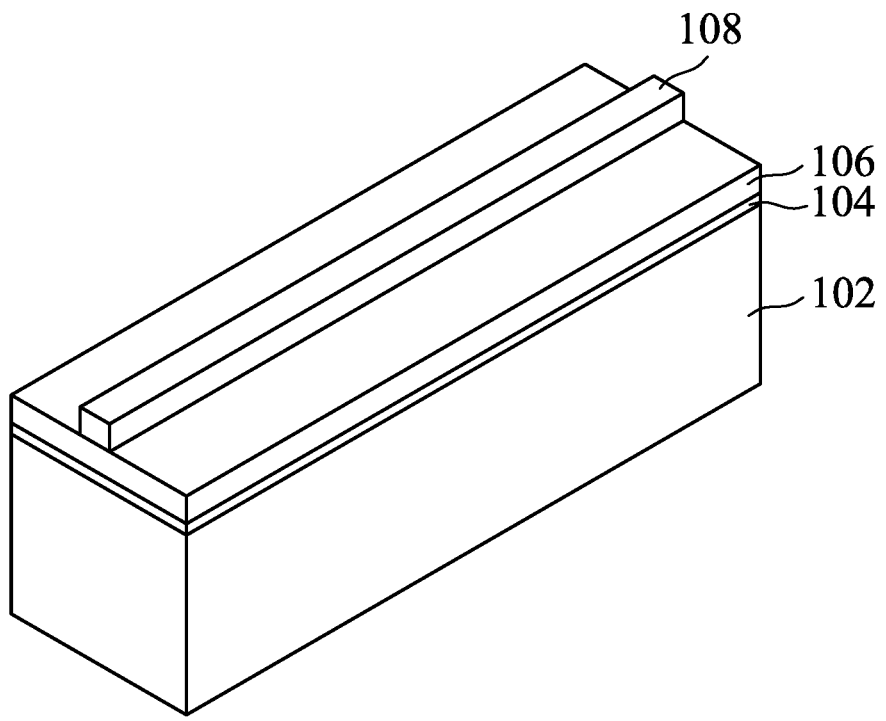
FIGS. 1A-1N are perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments for forming a fin field effect transistor (FinFET) device structure are provided. The method for forming the FinFET device structure may include forming an air gap between a gate structure and a contact, such that the capacitance between the gate structure and the contact may be reduced. In addition, the air gap and the gate structure may be covered by a mask layer. Therefore, the air gap and the gate structure may be protected during the subsequent etching process.

Figure 1B:
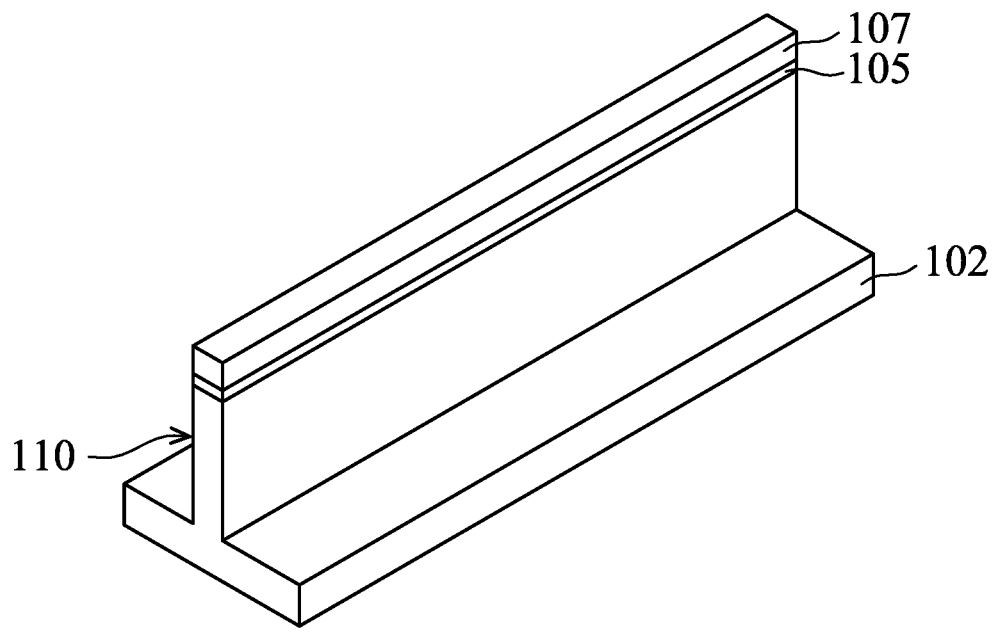
Figure 1C:
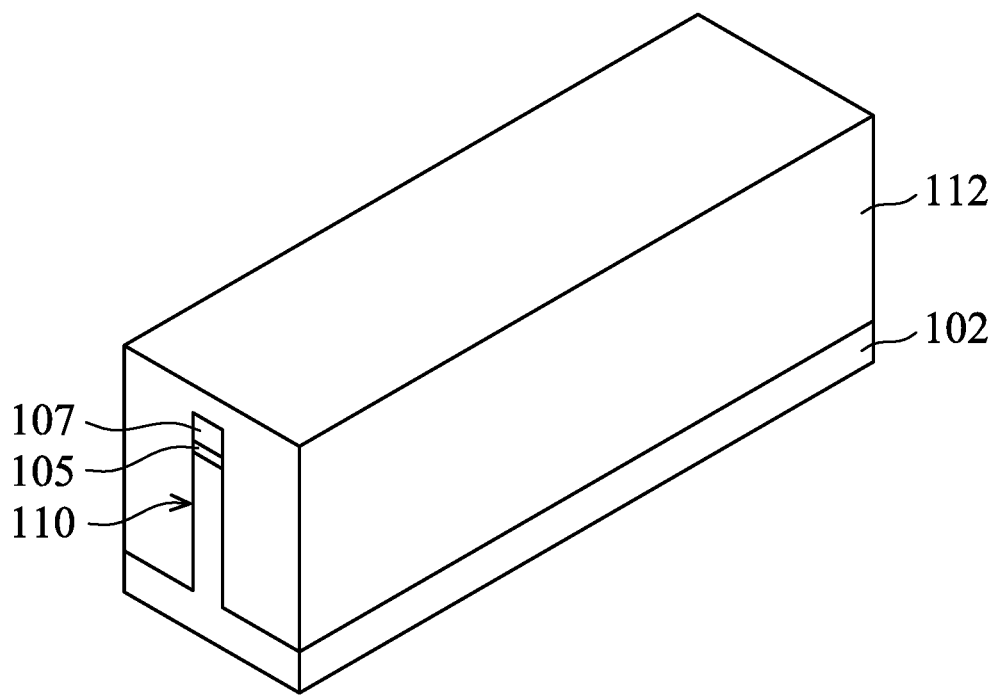
Figure 1D:
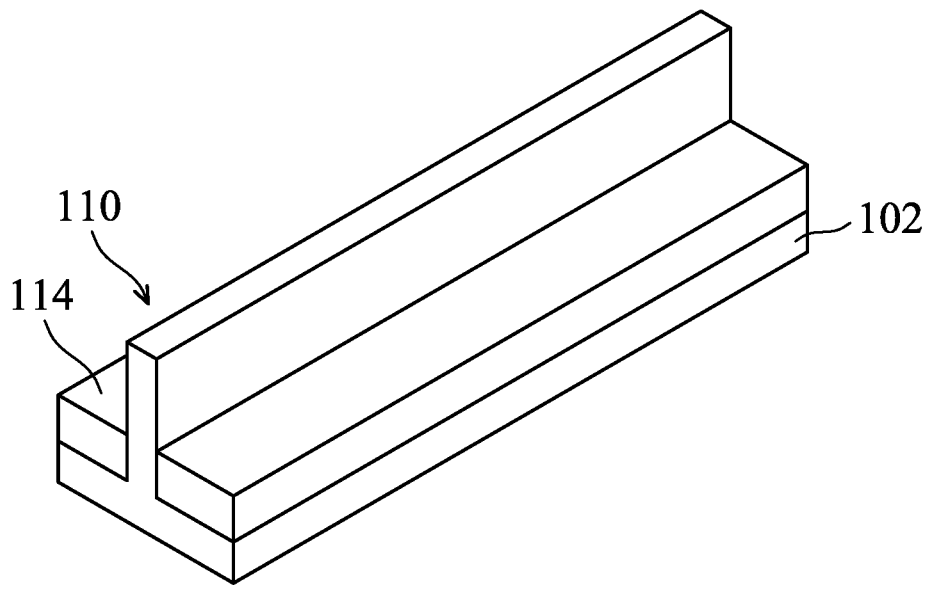
Figure 1E:
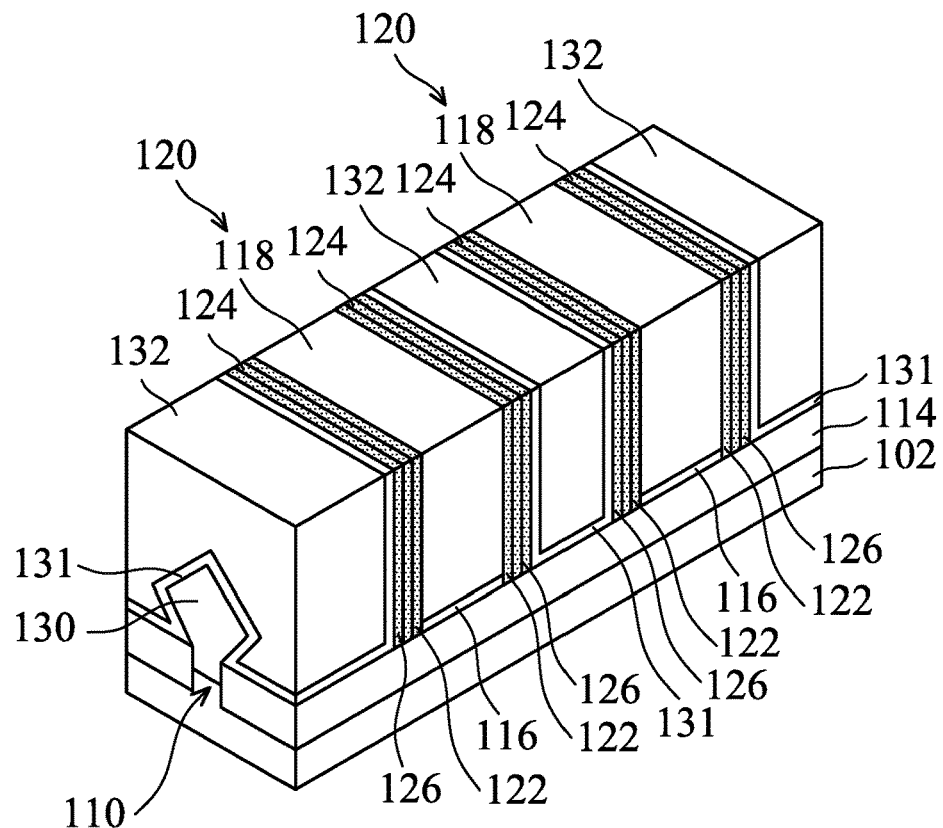
Figure 1F:
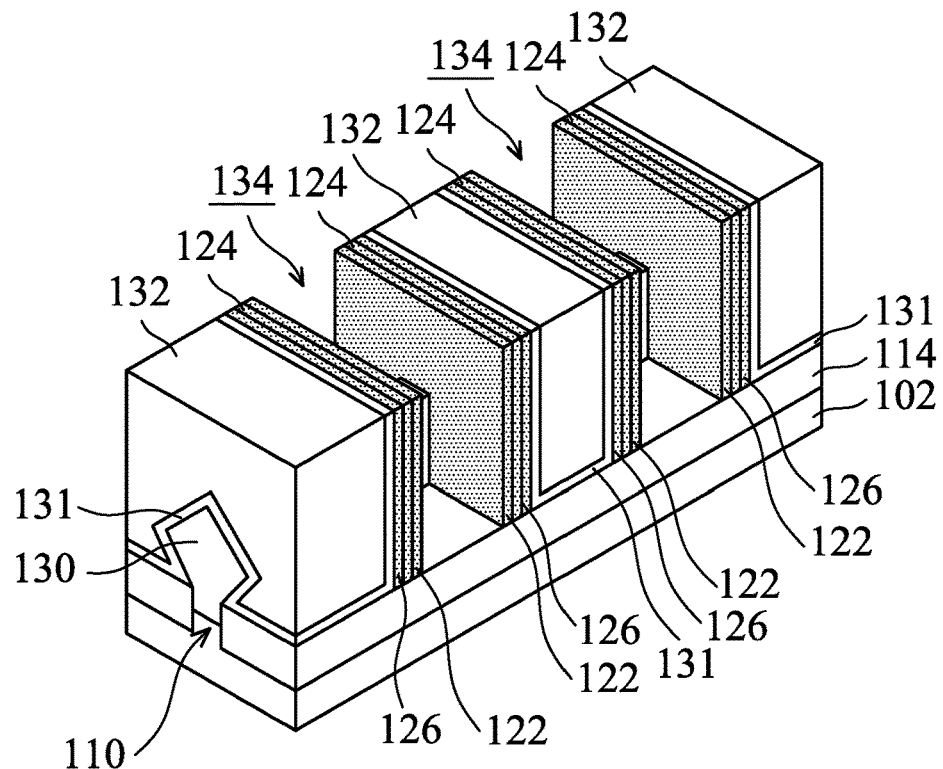
Figure 1G:
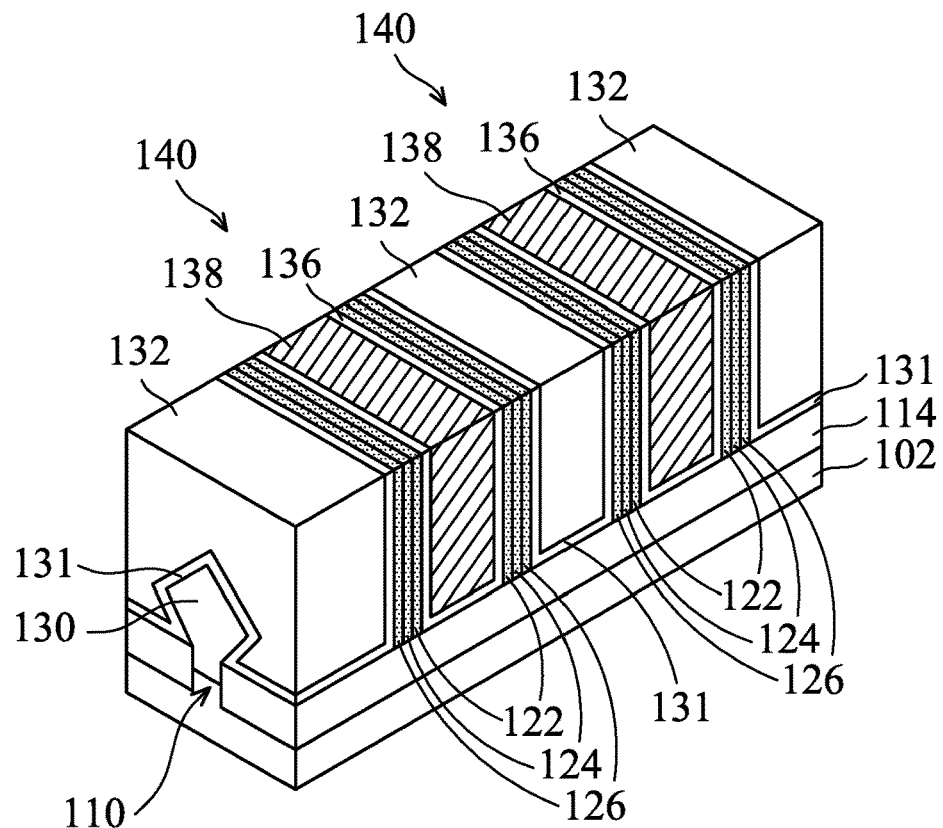
Figure 1H:
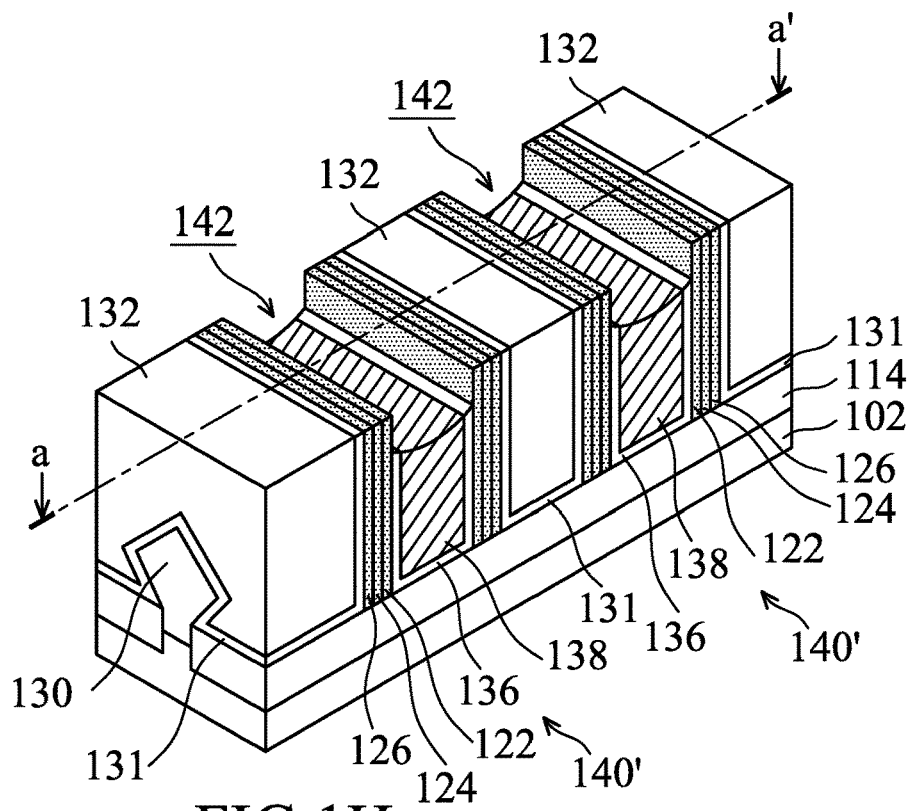
Figure 1I:
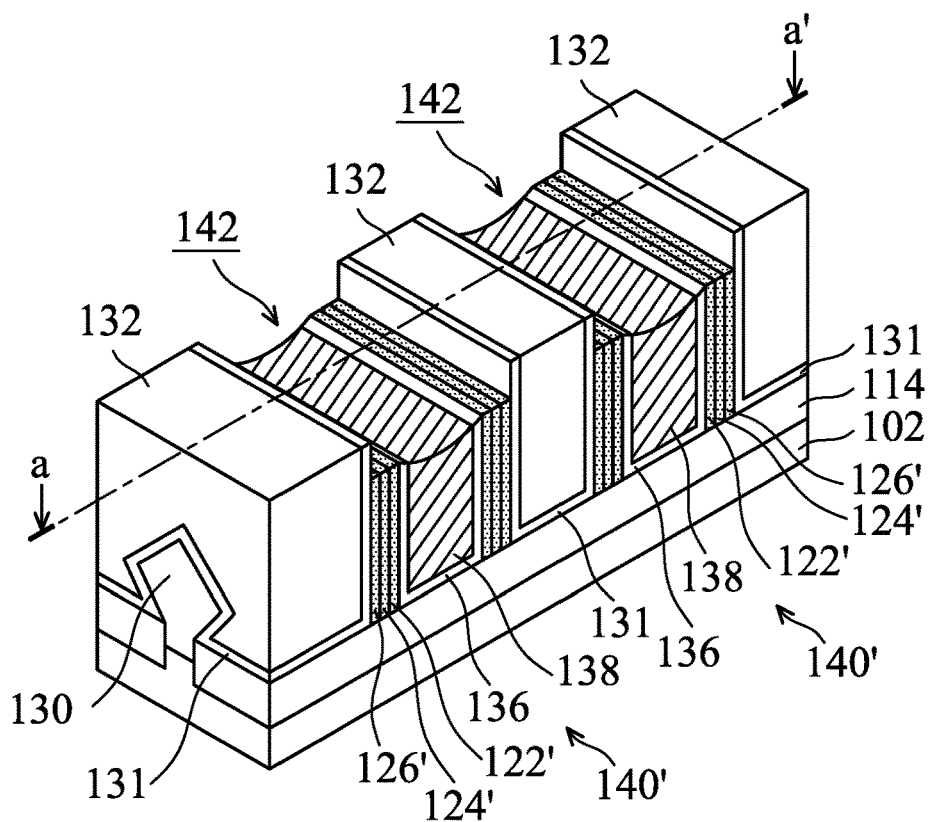
Figure 1J:
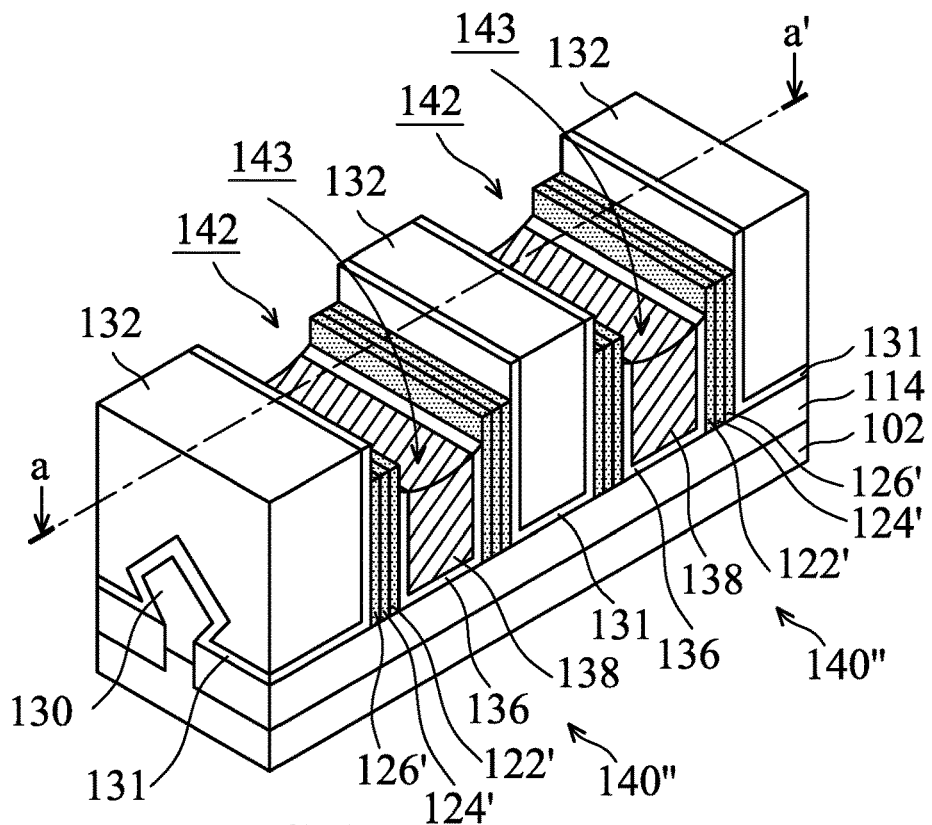
Figure 1K:
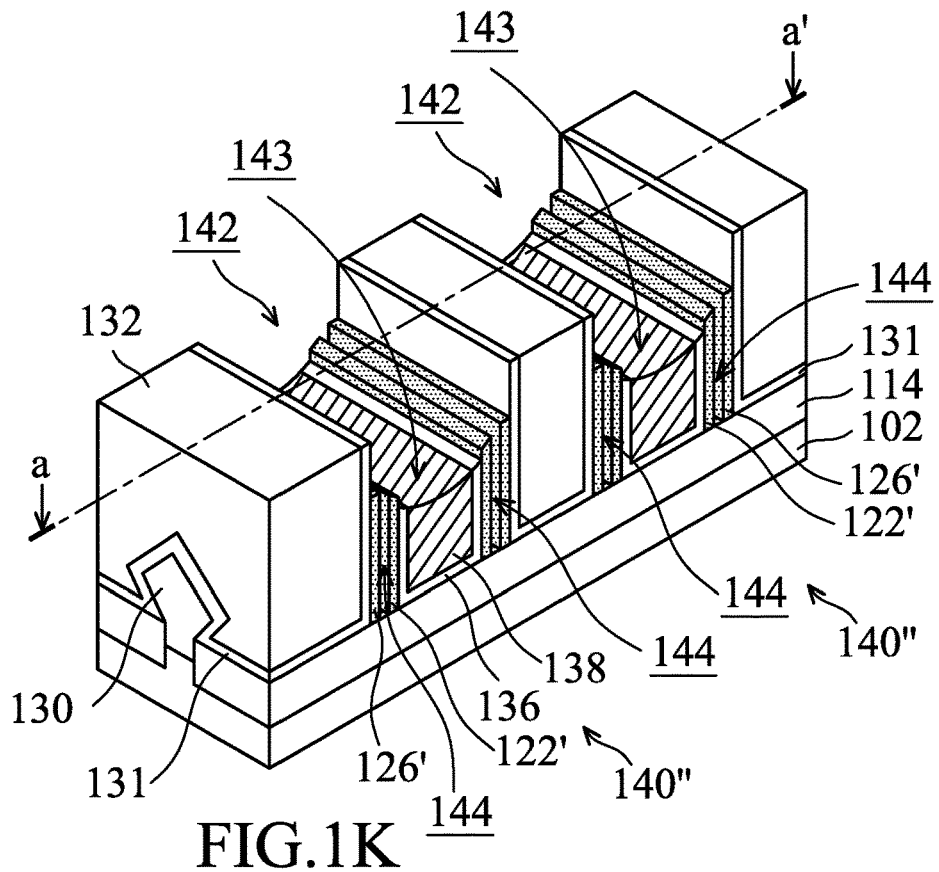
Figure 1L:
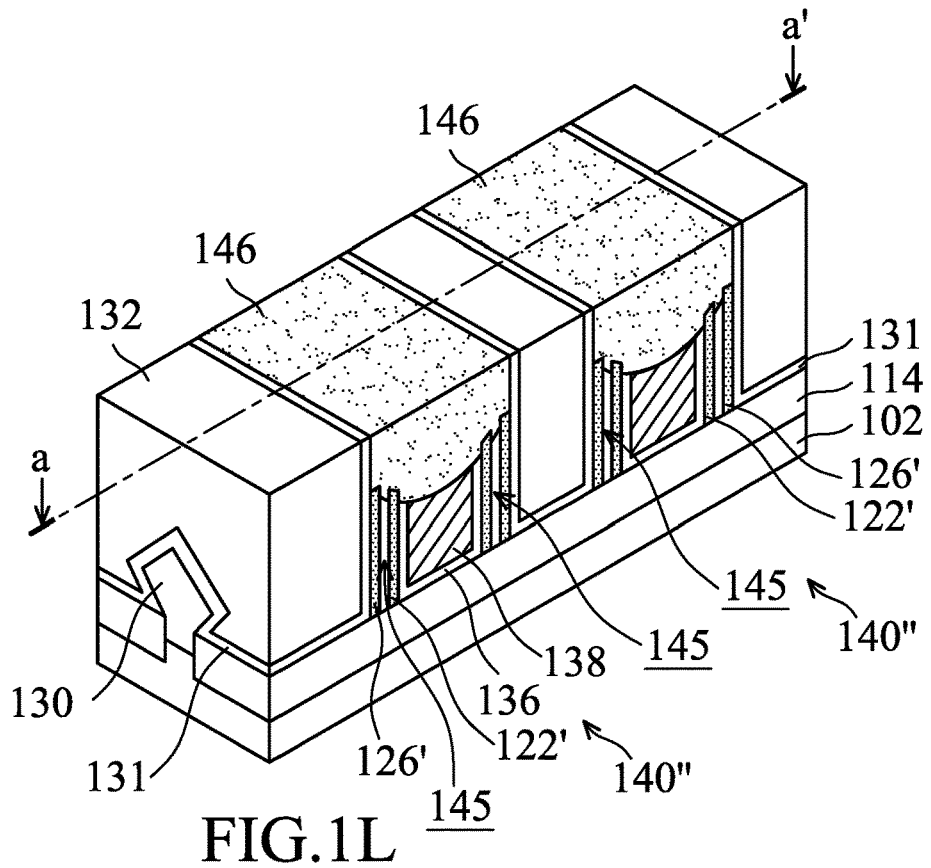
Figure 1M:
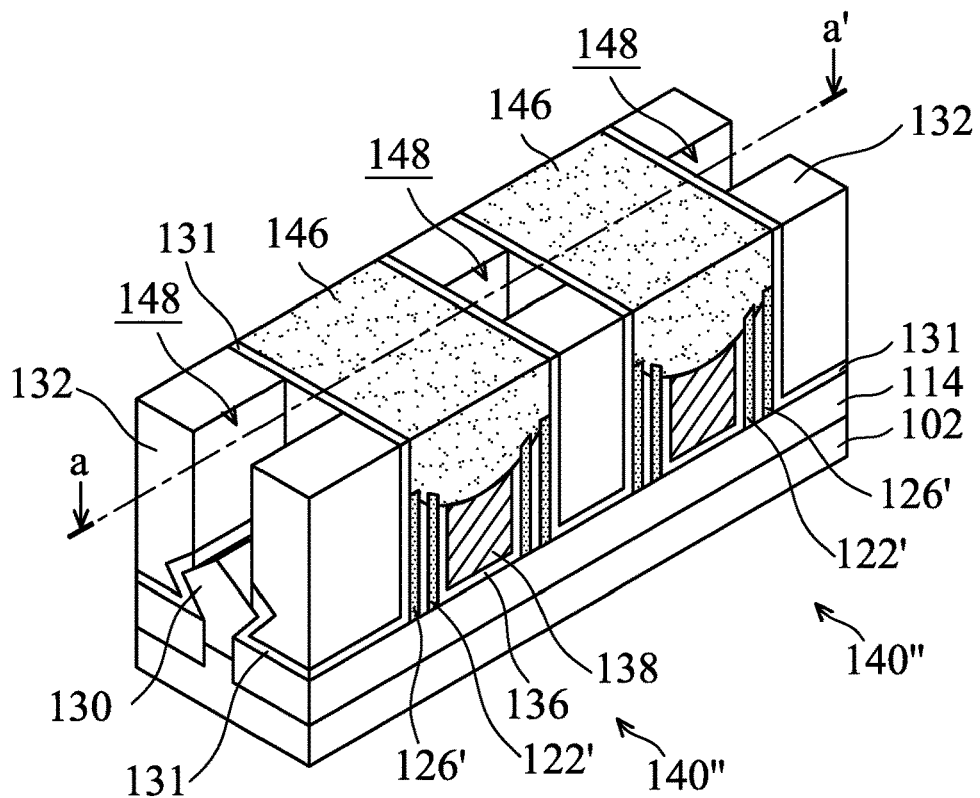
Figure 1N:
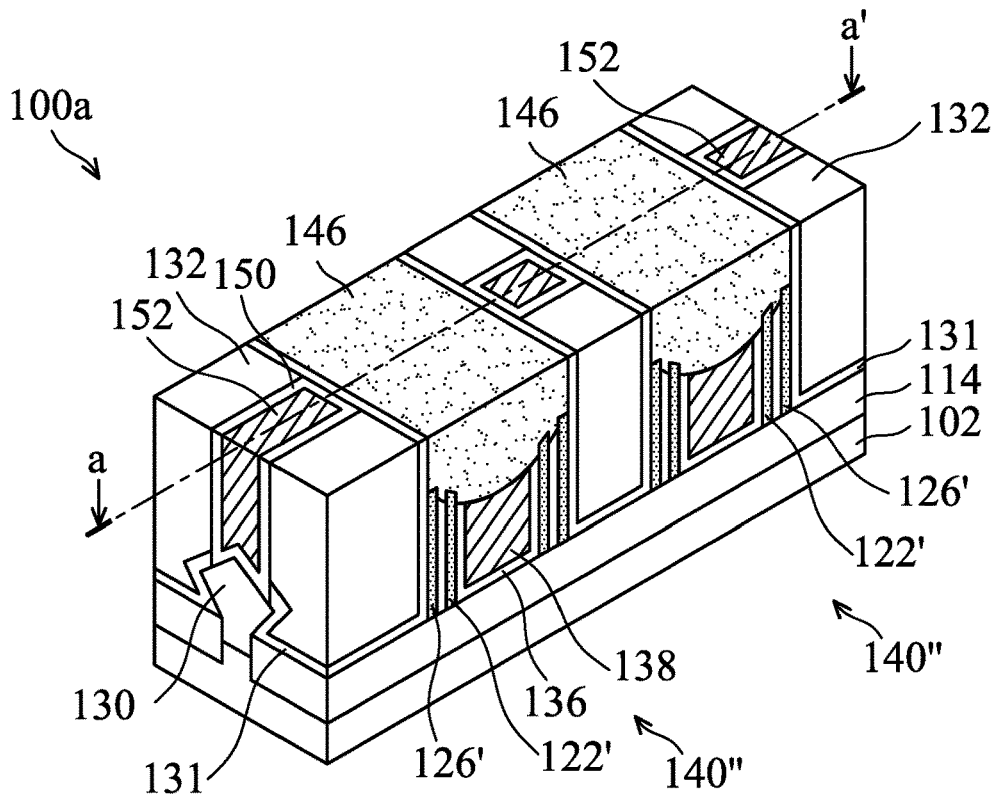

FIGS. 1A-1N are perspective representations of various stages of forming a FinFET device structure 100a, in accordance with some embodiments of the disclosure. FIGS. 2A-2G are cross-sectional representations of various stages of forming the FinFET device structure 100a shown in FIG. 1H-1N, in accordance with some embodiments of the disclosure. FIGS. 2A-2G are cross-sectional representations taken along line a-a' of FIGS. 1H-1N.

A substrate 102 is provided as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a patterned photoresist layer 108 is formed over the mask layer 106, as shown in FIG. 1A in accordance with some embodiments. The patterned photoresist layer 108 may be formed by a deposition process and a patterning process.

The deposition process for forming the patterned photoresist layer 108 may include a chemical vapor deposition (CVD) process, a high-density plasma chemical vapor deposition (HDPCVD) process, a spin-on process, a sputtering process, or another applicable process. The patterning process for forming the patterned photoresist layer 108 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Moreover, the dielectric layer 104 may be a buffer layer between the substrate 102 and the mask layer 106. In some embodiments, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 may be formed by deposition processes, which may include a chemical vapor deposition (CVD) process, a high-density plasma chemical vapor deposition (HDPCVD) process, a spin-on process, a sputtering process, or another applicable process.

After the patterned photoresist layer 108 is formed, the dielectric layer 104 and the mask layer 106 are patterned by using the patterned photoresist layer 108 as a mask, as shown in FIG. 1B in accordance with some embodiments. As a result, a patterned pad layer 105 and a patterned mask layer 107 are obtained. Afterwards, the patterned photoresist layer 108 is removed.

Next, an etching process is performed on the substrate 102 to form a fin structure 110 by using the patterned dielectric layer 105 and the patterned mask layer 107 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

After the fin structure 110 is formed, an insulating layer 112 is formed to cover the fin structure 110, the patterned pad layer 105, and the patterned mask layer 107 over the substrate 102, as shown in FIG. 1C in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Next, the insulating layer 112 is thinned or planarized to expose the top surface of the patterned mask layer 107. In some embodiments, the insulating layer 112 is thinned by a chemical mechanical polishing (CMP) process. Afterwards, the patterned dielectric layer 105 and the patterned mask layer 107 are removed.

After the patterned dielectric layer 105 and the patterned mask layer 107 are removed, an upper portion of the insulating layer 112 is removed to form an isolation structure 114, as shown in FIG. 1D in accordance with some embodiments. The isolation structure 114 may be a shallow trench isolation (STI) structure surrounding the fin structure 110.

In some embodiments, a portion of the fin structure 110 is embedded in the isolation structure 114. More specifically, a lower portion of the fin structure 110 is surrounded by the isolation structure 114, while an upper portion of the fin structure 110 protrudes from the isolation structure 114. The isolation structure 114 is configured to prevent electrical interference or crosstalk.

After the isolation structure 114 is formed, dummy gate structures 120 are formed across the fin structure 110 and extends over the isolation structure 114, as shown in FIG. 1E in accordance with some embodiments. In some embodiments, each of the dummy gate structures 120 includes a dummy gate dielectric layer 116 and a dummy gate electrode layer 118 formed over the dummy gate dielectric layer 116.

After the dummy gate structures 120 are formed, first spacers 122, second spacers 124 and third spacers 126 are formed on opposite sidewalls of each of the dummy gate structures 120. More specifically, a pair of first spacers 122 is formed on opposite sidewalls of each of the dummy gate structures 120, a pair of second spacers 124 is formed over the first spacers 122, and a pair of third spacers 126 is formed over the second spacers 124.

In order to improve the speed of the FinFET device structure 100a, the first spacers 122, the second spacers 124, and the third spacers 126 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the first spacers 122, the second spacers 124, and the third spacers 126 are made of extreme low-k (ELK) dielectric materials with a dielectric constant less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

In some embodiments, the first spacers 122 and the third spacers 126 are made of the same material, and the material of the second spacers 124 is different from the material of the first spacers 122 and the third spacers 126. For example, the first spacers 122 and the third spacers 126 are made of nitride, and the second spacers 124 are made of oxide. In addition, the first spacers 122, the second spacers 124, and the third spacers 126 are deposited by deposition processes, such as a chemical vapor deposition (CVD) process, a physical vapor deposition (PVD) process, a spin coating process, or another applicable process.

Afterwards, source/drain (S/D) structures 130 are formed over the fin structure 110. In some embodiments, portions of the fin structure 110 adjacent to the dummy gate structures 120 are recessed to form recesses at two sides of the fin structure 110, and a strained material is grown in the recesses by an epitaxial (epi) process to form the S/D structures 130. In addition, the lattice constant of the strained material may be different from the lattice constant of the substrate 102. In some embodiments, the S/D structures 130 include Ge, SiGe, InAs, InGaAs, InSb, GaAs, GaSb, InAlP, InP, or the like.

After the source/drain (S/D) structures 130 are formed, a contact etch stop layer (CESL) 131 is formed over the substrate 102, and an inter-layer dielectric (ILD) structure 132 is formed over the CESL 131. More specifically, the CESL 131 is formed over the S/D structures 130, the isolation structure 114, and the sidewalls of the third spacers 126. In some embodiments, the CESL 131 is made of silicon nitride, silicon oxynitride, and/or other applicable materials. Moreover, the CESL 131 may be formed by plasma enhanced CVD, low-pressure CVD, atomic layer deposition (ALD), or other applicable processes.

In some embodiments, the ILD structure 132 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 132 may be formed by chemical vapor deposition (CVD), physical vapor deposition, (PVD), atomic layer deposition (ALD), spin-on coating, or another applicable process.

Afterwards, a planarizing process is performed on the ILD structure 132 until the top surfaces of the dummy gate structures 120 are exposed, as shown in FIG. 1E in accordance with some embodiments. After the planarizing process, the top surfaces of the dummy gate structures 120 may be substantially level with the top surfaces of the first spacers 122, the second spacers 124, the third spacers 126, and the ILD structure 132. In some embodiments, the planarizing process includes a grinding process, a chemical mechanical polishing (CMP) process, an etching process, another applicable process, or a combination thereof.

Next, the dummy gate structures 120 are removed to form trenches 134 in the ILD structure 132, as shown in FIG. 1F in accordance with some embodiments. More specifically, each of the trenches 134 is formed between each pair of first spacers 122, and the fin structure 110 is exposed by the trenches 134. The dummy gate dielectric layer 116 and the dummy gate electrode layer 118 are removed by an etching process, such as a dry etching process or a wet etching process.

After the trenches 134 are formed, gate structures 140 are formed in the trenches 134, as shown in FIG. 1G in accordance with some embodiments. In some embodiments, each of the gate structures 140 includes a gate dielectric layer 136 and a gate electrode layer 138. In addition, each of the gate structures 140 may include a work function layer (not shown) between the gate dielectric layer 136 and the gate electrode layer 138.

Each of the gate dielectric layers 136 may be a single layer or multiple layers. In some embodiments, the gate dielectric layers 136 are made of silicon oxide, silicon nitride, silicon oxynitride (SiON), dielectric material(s) with high dielectric constant (high-k), or a combination thereof. In some embodiments, the gate dielectric layers 136 are deposited by a plasma enhanced chemical vapor deposition (PECVD) process or a spin coating process.

Moreover, the gate electrode layers 138 are made of a conductive material such as aluminum (Al), copper (Cu), tungsten (W), titanium (Ti), tantalum (Ta), or another applicable material, in accordance with some embodiments. The gate electrode layers 138 may be formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

The work function layers (not shown) may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

Figure 2A:
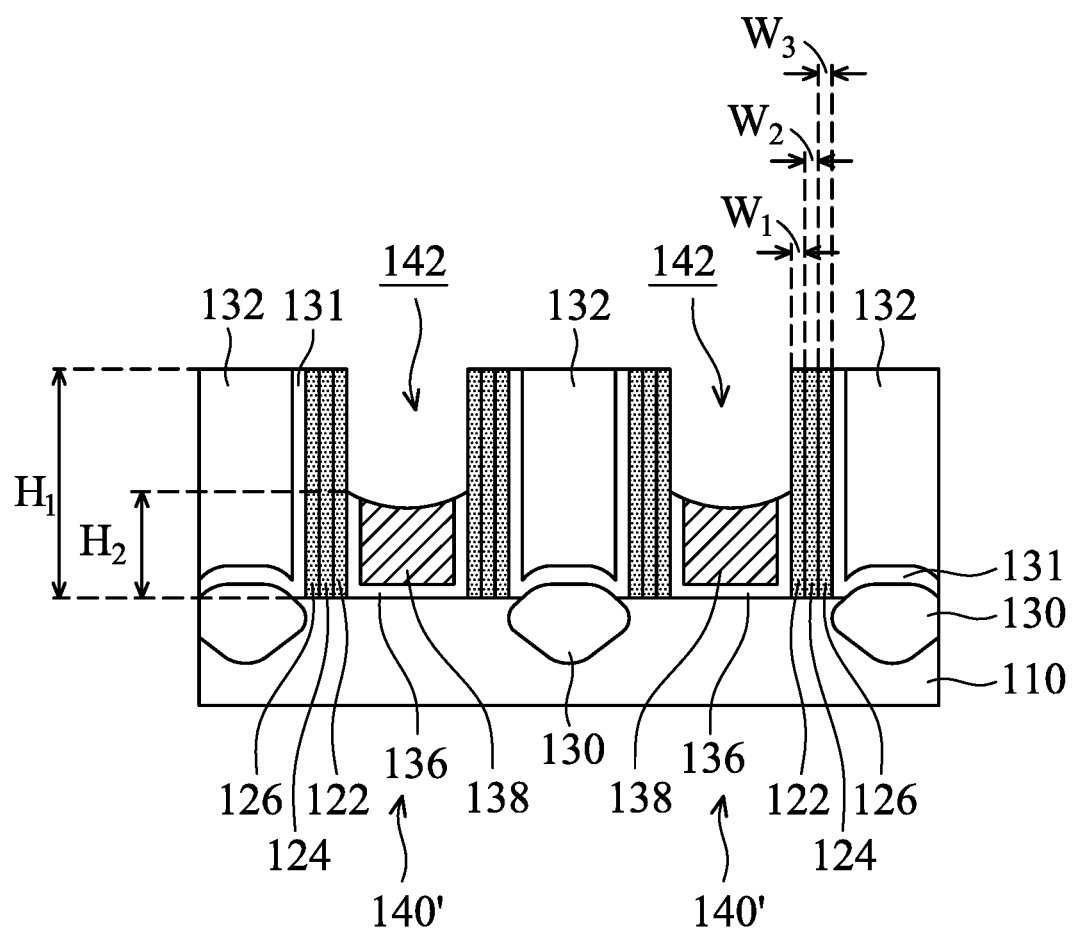
FIGS. 2A-2G are cross-sectional representations of various stages of forming a FinFET device structure shown in FIG. 1H-1N, in accordance with some embodiments of the disclosure.

After the gate structures 140 are formed, a top portion of each of the gate structures 140 is removed, as shown in FIGS. 1H and 2A in accordance with some embodiments. In some embodiments, the top portion of each of the gate dielectric layer 136 and the gate electrode layer 138 are removed by an etching process, such as a dry etching process. The dry etching process may include a plasma etching process. Therefore, first openings 142 are formed above the remaining gate structures 140', and sidewalls of the first spacers 122 are exposed by the first openings 142.

After the first openings 142 are formed, the first spacers 122, the second spacers 124, and the third spacers 126 have a first height $H_1$ above the top surface of the fin structure 110, and the remaining gate structures 140' have a second height $H_2$ above the top surface of the fin structure 110. In some embodiments, a ratio ($H_1/H_2$) of the first height $H_1$ to the second height $H_2$ is in a range from about 1.5 to about 2.5. In some embodiments, the first height $H_1$ is in a range from about 45 nm to about 135 nm, and the second height $H_2$ is in a range from about 30 nm to about 55 nm.

Moreover, the first spacers 122 have a first width $W_1$, the second spacers 124 have a second width $W_2$, and the third spacers 126 have a third width $W_3$. In some embodiments, each of the first width $W_1$, the second width $W_2$, and the third width $W_3$ is in a range from about 1 nm to about 10 nm. In some embodiments, the first width $W_1$, the second width $W_2$, and the third width $W_3$ are substantially the same.

Figure 2B:
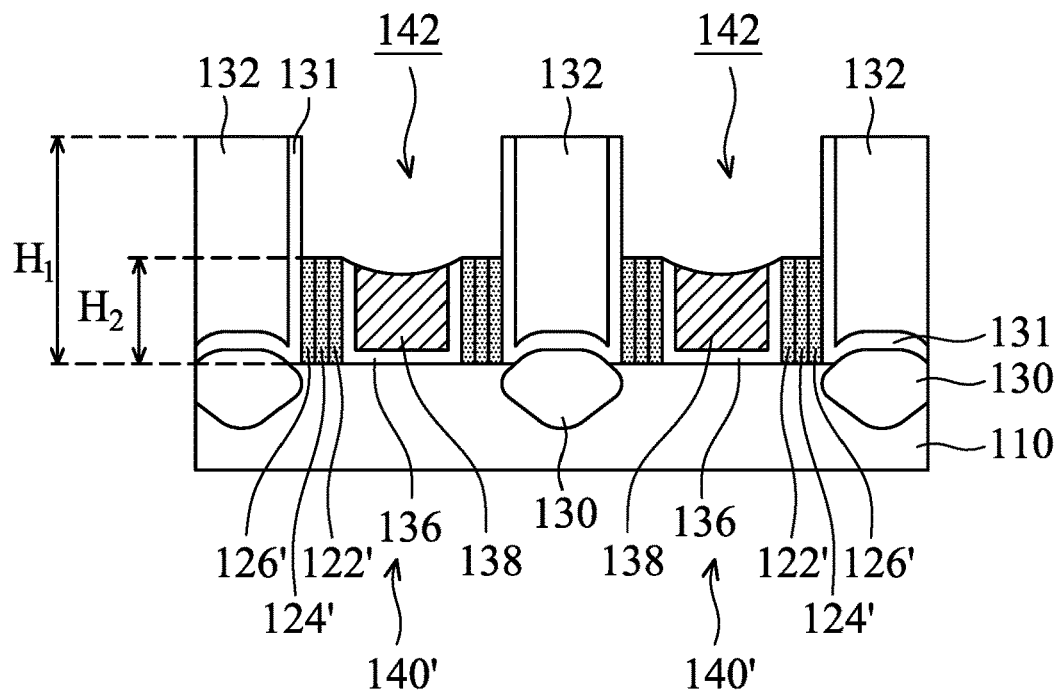

Next, the first spacers 122, the second spacers 124, and the third spacers 126 are partially removed through the first openings 142, as shown in FIGS. 1I and 2B in accordance with some embodiments. More specifically, a top portion of each of the first spacers 122, a top portion of each of the second spacers 124, and a top portion of each of the third spacers 126 are removed by an etching process, such as a dry etching process. As a result, a portion of the sidewalls of the CESL 131 are exposed, and the first spacers 122', the second spacers 124' and the third spacers 126' are left.

Moreover, in some embodiments, the top surfaces of the first spacers 122', the second spacers 124', and the third spacers 126' are substantially coplanar with each other. In some embodiments, the first spacers 122', the second spacers 124', and the third spacers 126' have the second height $H_2$, which is substantially the same as the height of the remaining gate structures 140'.

Figure 2C:
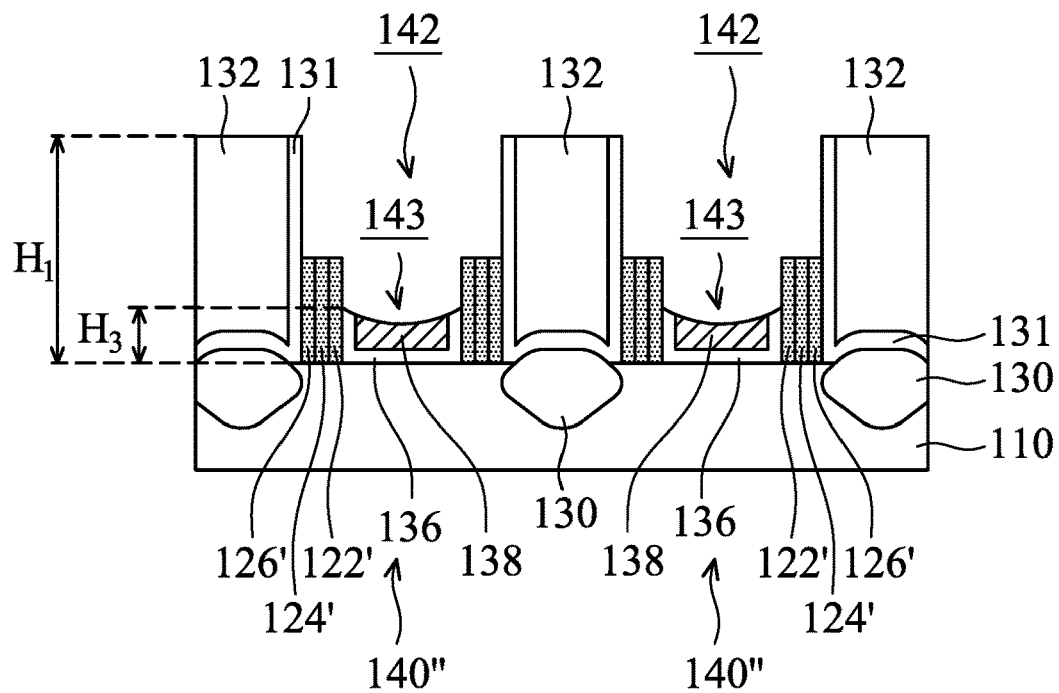

Afterwards, a top portion of each of the remaining gate structures 140' is removed such that second openings 143 are formed below the first openings 142, as shown in FIGS. 1J and 2C in accordance with some embodiments.

More specifically, after the top portions of the first spacers 122, the second spacers 124, and the third spacers 126 are removed through the first openings 142, the top portion of each of the remaining gate structures 140' exposed by the first openings 142 are removed by an etching process, such as a dry etching process. Therefore, the second openings 143 are formed below the first openings 142 and above the remaining gate structures 140", and a portion of the sidewalls of the first spacers 122' are exposed through the second openings 143.

It should be noted that, the remaining gate structures 140" below the second openings 143 have a third height $H_3$ above the top surface of the fin structure 110. In some embodiments, a ratio ($H_1/H_3$) of the first height $H_1$ to the third height $H_3$ is in a range from about 4 to about 7. In some embodiments, the third height $H_3$ is in a range from about 10 nm to about 30 nm.

When the ratio ($H_1/H_3$) of the first height $H_1$ to the third height $H_3$ is too large, the third height $H_3$ of the remaining gate structures 140" may be too small, and high leakage current may occur. When the ratio ($H_1/H_3$) of the first height $H_1$ to the third height $H_3$ is too small, the third height $H_3$ of the remaining gate structures 140" may be too large, and the remaining gate structures 140" may not be fully protected by the mask layer 146 (formed subsequently) during the self-aligned etching for forming the contact openings 148 in the subsequent processes.

Figure 2D:
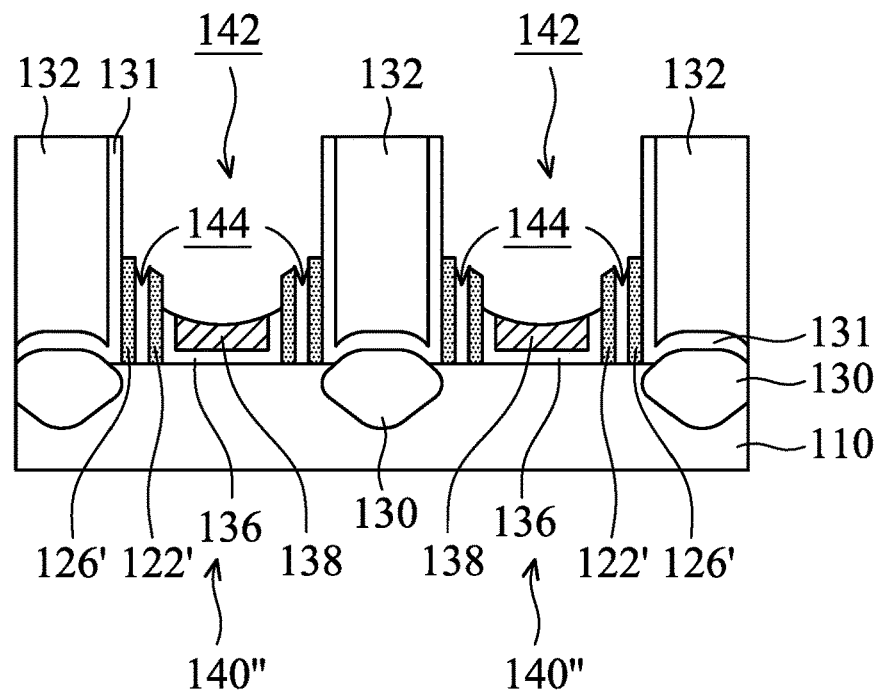

After the second openings 143 are formed, the second spacers 124' are removed, as shown in FIGS. 1K and 2D in accordance with some embodiments. The second spacers 124' are removed by an etching process, such as a dry etching process. As a result, gaps 144 between the first spacers 122' and the third spacers 126' are obtained, and a portion of the fin structure 110 is exposed by the gaps 144.

As described previously, the material for forming the first spacers 122' and the third spacers 126' may be the same, and the material for forming the first spacers 122' and the third spacers 126' may be different. In some embodiments, the etching selectivity of the first spacers 122' with respect to the second spacers 124' and the etching selectivity of the third spacers 126' with respect to the second spacers 124' are relatively high. Therefore, the second spacers 124' are removed by the etching process while the first spacers 122' and the third spacers 126' may be substantially left, such that the gaps 144 are formed.

The term of "selectivity" or "etching selectivity" is defined as the ratio of etching rate of one material (the reference material) relative to another material (the material of interest). An increase in etching selectivity means that the selected material, or material of interest, is harder to etch. A decrease in etching selectivity means that the selected material is easier to etch. More specifically, the high etching selectivity of the first spacers 122' and the third spacers 126' means that the first spacers 122' and the third spacers 126' are not easy to damage or etch during the etching process of the second spacers 124'.

In some embodiments, a top portion of each of the first spacers 122' is simultaneously removed during the etching process of the second spacers 124'. In this case, the top surfaces of the third spacers 126' are higher than the top surfaces of the first spacers 122' after the etching process of the second spacers 124' is performed. However, the top surfaces of the third spacers 126' and the top surfaces of the first spacers 122' are still higher than the top surfaces of the remaining gate structures 140' after the second spacers 124' are removed.

Figure 2E:
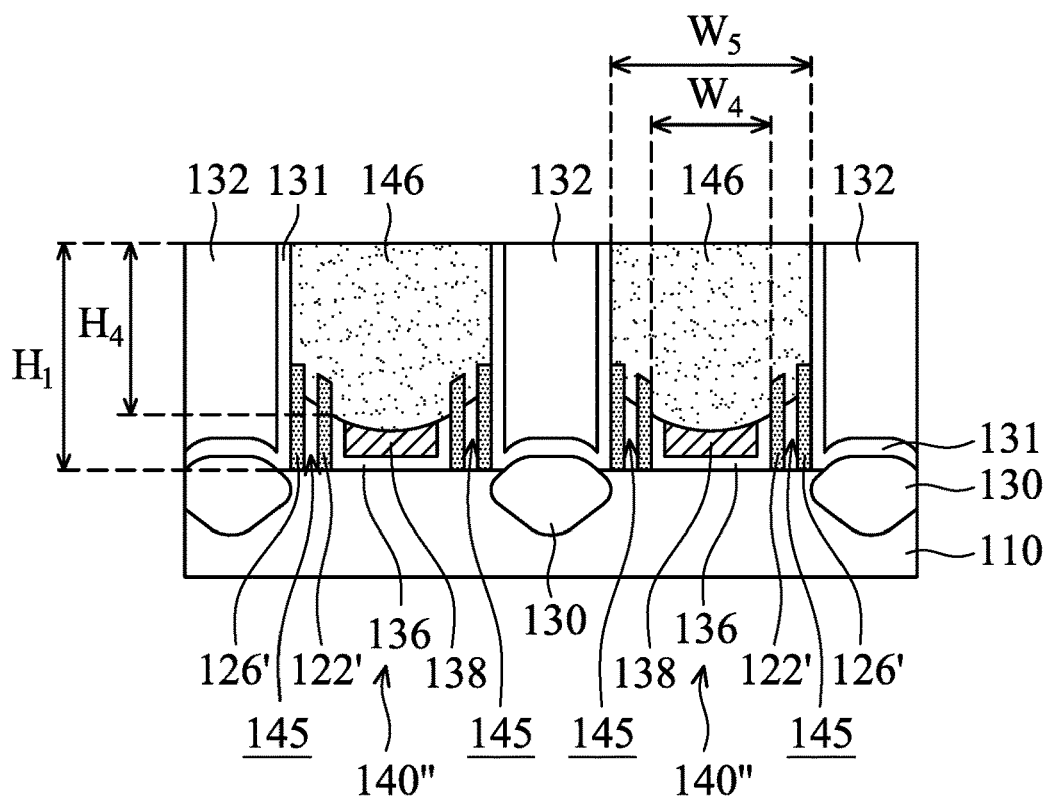

Next, a mask layer 146 is formed over the remaining gate structures 140", the first spacers 122', and the third spacers 126', as shown in FIGS. 1L and 2E in accordance with some embodiments. The mask layer 146 is used as a mask for performing a self-aligned etching process to form contacts electrically connected to the S/D structures 130, which will be described in more detail later. The first openings 142 and the second openings 143 are filled by the mask layer 146. In should be noted that, the gaps 144 are covered by the mask layer 146 such that air gaps 145 are formed in the gaps 144.

In some embodiments, the mask layer 146 extends into the gaps 144 such that the mask layer 146 and the fin structure 110 are separated by the air gaps 145 in the gaps 144. It should be noted that, a top portion of each of the first spacers 122' is embedded in the mask layer 146. More specifically, the top surfaces of the first spacers 122' are higher than the interfaces between the mask layer 146 and the air gaps 145. In some embodiments, the interfaces between the mask layer 146 and the air gaps 145 are higher than the top surfaces of the remaining gate structures 140".

The mask layer 146 has a fourth height $H_4$ over the remaining gate structures 140". In some embodiments, a ratio ($H_1/H_4$) of the first height $H_1$ to the fourth height $H_4$ is in a range from about 4 to about 5. In some embodiments, the fourth height $H_4$ is in a range from about 10 nm to about 30 nm. In some other embodiments, the fourth height $H_4$ is in a range from about 30 nm to about 60 nm.

When the ratio ($H_1/H_4$) of the first height $H_1$ to the fourth height $H_4$ is too large, the fourth height $H_4$ of the mask layer 146 may be too small, and the mask layer 146 may not be able to protect the remaining gate structures 140" from damage during the subsequent etching processes. When the ratio ($H_1/H_4$) of the first height $H_1$ to the fourth height $H_4$ is too small, the remaining gate structures 140" may be too small, and high leakage current may occur.

Moreover, the remaining gate structures 140" have a fourth width $W_4$, and the mask layer 146 has a fifth width $W_5$. In some embodiments, the fifth width $W_5$ is greater than the fourth width $W_4$, and the difference between the fifth width $W_5$ and the fourth width $W_4$ is in a range from about 5 nm to about 10 nm. In some embodiments, a ratio ($W_5/W_4$) of the fifth width $W_5$ to the fourth width $W_4$ is in a range from about 1.5 to about 2.

When the ratio ($W_5/W_4$) of the fifth width $W_5$ to the fourth width $W_4$ is too large, the fourth width W4 of the remaining gate structures 140" may be too small, and high leakage current may occur. When the ratio ($W_5/W_4$) of the fifth width $W_5$ to the fourth width $W_4$ is too small, the air gaps 145 may be too narrow, and the capacitance between the remaining gate structures 140" and the contacts 152 (formed subsequently) may not be reduced efficiently.

In some embodiments, the mask layer 146 is made of oxide or silicon nitride. In some other embodiments, the mask layer 146 is made of silicon oxide, silicon carbonitride (SiCN), silicon oxide carbonitride (SiOCN), or SiLK. It should be noted that the material of the mask layer 146 is different from the material of the ILD structure 132. In some embodiments, the mask layer 146 may be formed by deposition process, such as a chemical vapor deposition (CVD) process, an atomic layer deposition (ALD) process, or another applicable process. In addition, the mask layer 146 may be formed by a single deposition process or multiple deposition processes.

Figure 2F:
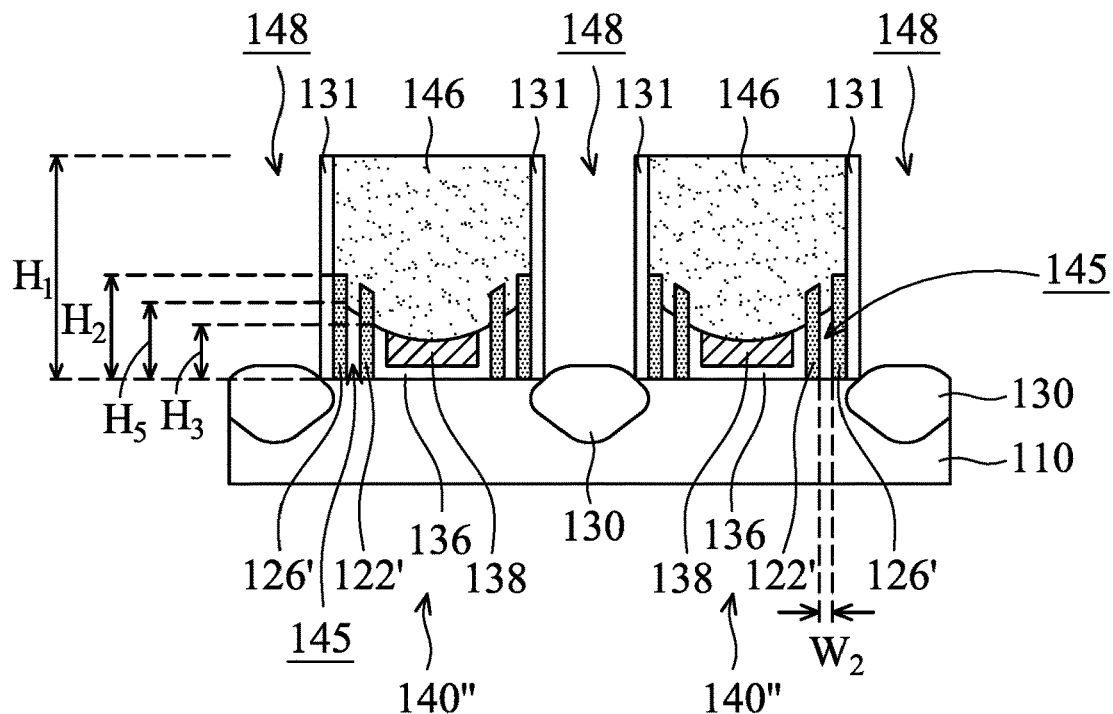

After the mask layer 146 is formed, a portion of the ILD structure 132 is removed to form contact openings 148, as shown in FIGS. 1M and 2F in accordance with some embodiments. Specifically, the ILD structure 132 and the CESL 131 are partially removed by an etching process, such as a dry etching process. As a result, a portion of each of the S/D structures 130 is exposed by the contact openings 148.

It should be noted that, the etching selectivity of the ILD structure 132 with respect to the mask layer 146 is high. Therefore, the etching process for forming the contact openings 148 is a self-aligned etching process. More specifically, the portion of the ILD structure 132 is removed by the etching process while the mask layer 146 is not removed. Since the remaining gate structures 140" are protected by the mask layer 146, the remaining gate structures 140" are not damaged by the etchant during the etching process for forming the contact openings 148.

In some embodiments, the width of each of the air gaps 145 is the same as the second width $W_2$ of the second spacers 124', and the air gaps 145 have a fifth height $H_5$ above the top surface of the fin structure 110. In some embodiments, an aspect ratio ($H_5/W_2$) of each of the air gaps 145 is in a range from about 3 to about 6.

When the aspect ratios of the air gaps 145 are too large, the capacitances between the remaining gate structures 140" and the contacts 152 may not be reduced efficiently. When the aspect ratios of the air gaps 145 are too small, the air gaps 145 may be filled up by the mask layer 146 easily, such that the capacitances between the remaining gate structures 140" and the contacts 152 may not be reduced efficiently as well.

In some other embodiments, the second spacers 124' are not entirely removed. For example, portions of the second spacers 124' are left after the etching process of the second spacers 124'. In this case, the width of each of the air gaps 145 may be different from the second width $W_2$ of the second spacers 124', and the width of each of the air gaps 145 may be in a range from about 1 nm to about 5 nm. For example, the width of each of the air gaps 145 may be about 3 nm.

Furthermore, in some embodiments, the fifth height $H_5$ of the air gaps 145 is greater than the third height $H_3$ of the remaining gate structures 140'. In some embodiments, a difference between the fifth height $H_5$ and the third height $H_3$ is in a range from about 1 nm to about 5 nm. For example, a difference between the fifth height $H_5$ and the third height $H_3$ is about 3 nm.

In addition, even if the top portions of the first spacers 122' are slightly etched during the etching process of the second spacers 124', the height of the first spacers 122' is similar to the second height $H_2$ of the third spacers 126'. In some embodiments, a ratio ($H_2/H_3$) of the second height $H_2$ to the third height $H_3$ is in a range from about 2 to about 3.

When the ratio ($H_2/H_3$) of the second height $H_2$ to the third height $H_3$ is too large, the remaining gate structures 140" may be too small, and high leakage current may occur. When the ratio ($H_2/H_3$) of the second height $H_2$ to the third height $H_3$ is too small, the remaining gate structures 140" may not be fully protected by the mask layer 146 during the self-aligned etching for forming the contact openings 148 in the subsequent processes.

Figure 2G:
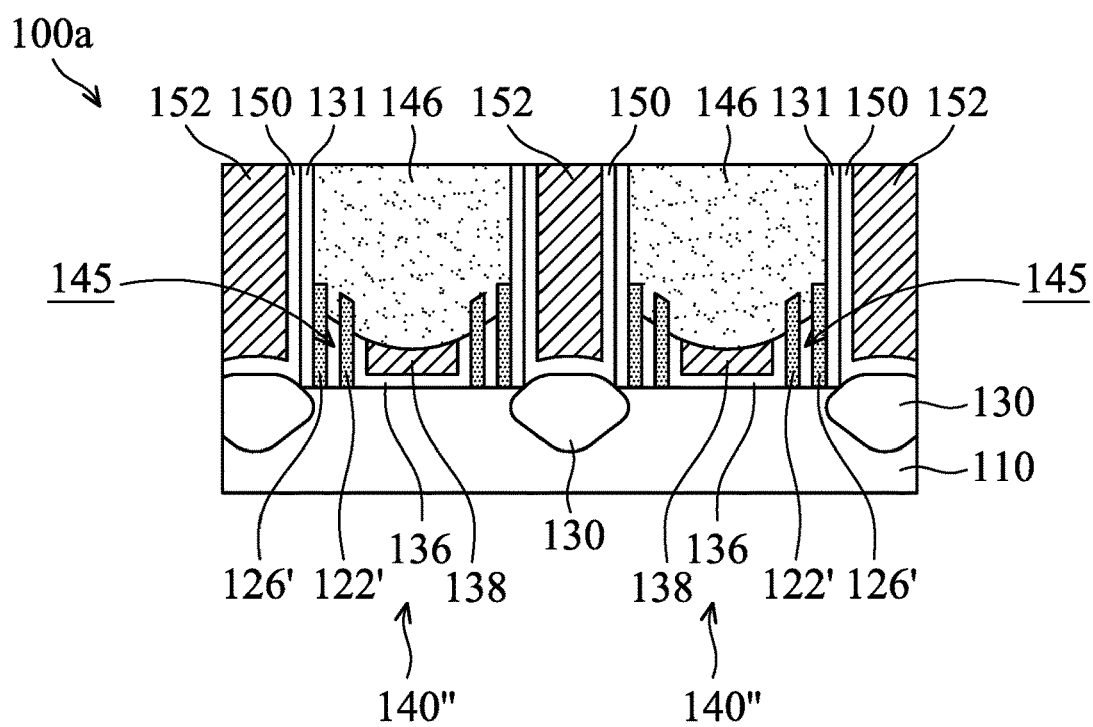

Afterwards, a barrier layer 150 is formed over the bottom surface and the sidewalls of each of the contact openings 148, and a contact 152 is formed over each of the barrier layer 150, as shown in FIGS. 1N and 2G in accordance with some embodiments. Each of the barrier layers 150 surrounds each of the contacts 152, and the ILD structure 132 surrounds the barrier layers 150. The contacts 152 are electrically connected to the S/D structures 130.

In some embodiments, the barrier layers 150 are made of tantalum (Ta), tantalum nitride (TaN), titanium (Ti), titanium nitride (TiN), cobalt tungsten (CoW) or another applicable material. In some embodiments, the barrier layers 150 are made of Ti/TiN/W, and tungsten (W) in the barrier layers 150 has a smaller grain size than the grain size of the contacts 152 when the contacts 152 are made of tungsten (W). In some embodiments, the barrier layers 150 are formed by a deposition process, such as a chemical vapor deposition (CVD) process, physical vapor deposition (PVD) process, atomic layer deposition (ALD) process, plating process or another application process.

In some embodiments, the contacts 152 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the contacts 152 are formed by a deposition process, such as a chemical vapor deposition (CVD) process, a physical vapor deposition (PVD) process, an atomic layer deposition (ALD) process, a plating process, or another application process.

In addition, a glue layer may optionally be formed between each of the barrier layers 150 and each of the contacts 152. The glue layers are used to improve adhesion between the barrier layers 150 and the contacts 152. After the contacts 152 are formed, the FinFET device structure 100a is obtained.

Moreover, in order to protect the remaining gate structures 140", the mask layer 146 is formed to cover the top surfaces of the remaining gate structures 140", and the fifth width $W_5$ of the mask layer 146 is greater than the fourth width $W_4$ of the remaining gate structures 140". In addition, the top surfaces of the first spacers 122' are higher than the top surfaces of the remaining gate structures 140", and the top portions of the first spacers 122' are embedded in the mask layer 146. As a result, the remaining gate structures 140" will not be damaged by the etching etchant which is used for forming the contact openings 148.

It should be noted that, in order to reduce the capacitances between the remaining gate structures 140" and the contacts 152, the air gaps 145, which have a dielectric constant (about 1) lower than that of the first spacers 122' and the third spacers 126', are formed between the remaining gate structures 140" and the contacts 152. As a result, the performance of the FinFET device structure 100a may be increased.

Figure 3:
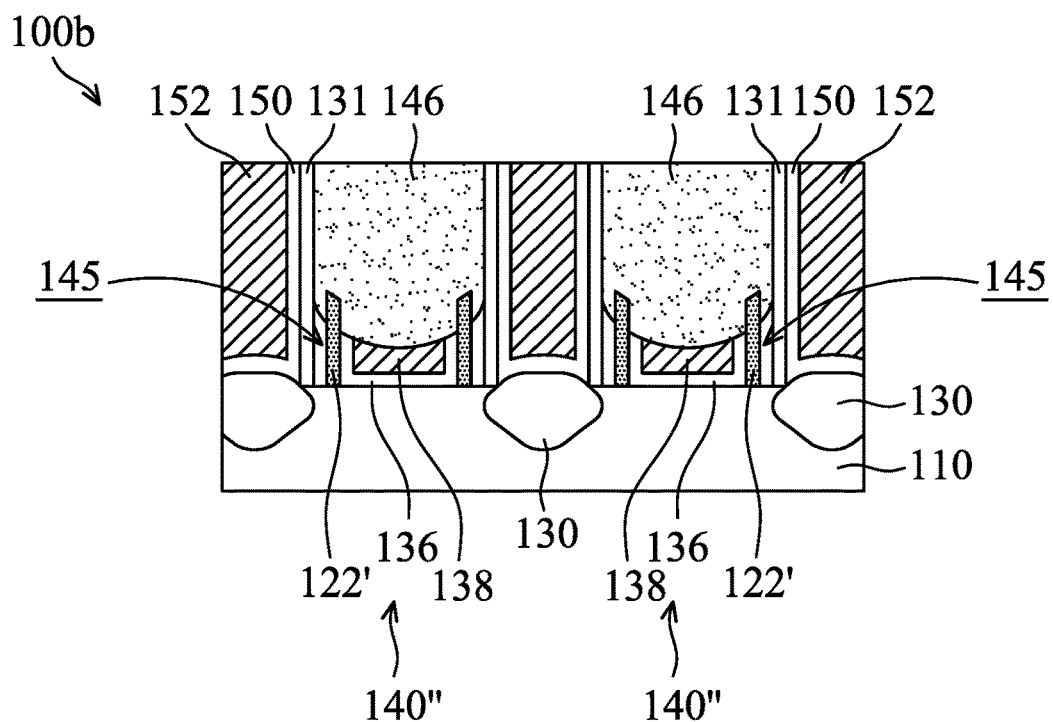
FIG. 3 is a cross-sectional representation of a modified FinFET device structure, in accordance with some embodiments of the disclosure.

FIG. 3 is a cross-sectional representation of a modified FinFET device structure 100b, in accordance with some embodiments of the disclosure. The FinFET device structure 100b is similar to the FinFET device structure 100a of FIG. 2G, and the difference between FIG. 3 and FIG. 2G is that the third spacers 126' are not formed in FIG. 3. Therefore, the air gaps 145 are sandwiched between the CESL 131 and the first spacers 122'.

Figure 4:
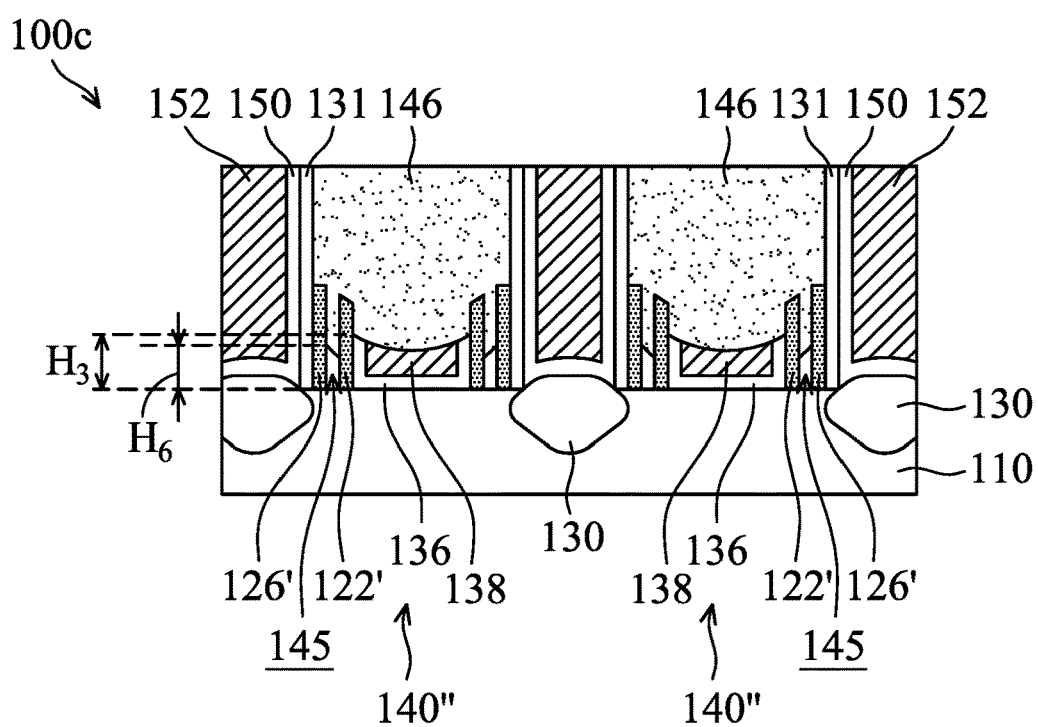
FIG. 4 is a cross-sectional representation of a modified FinFET device structure, in accordance with some embodiments of the disclosure.

FIG. 4 is a cross-sectional representation of a modified FinFET device structure 100c, in accordance with some embodiments of the disclosure. The FinFET device structure 100c is similar to the FinFET device structure 100a of FIG. 2G, and the difference between FIG. 4 and FIG. 2G is that the heights of the air gaps 145 in FIG. 4 are smaller than the heights of the air gaps 145 in FIG. 2G.

More specifically, the air gaps 145 in FIG. 4 have a sixth height $H_6$ above the top surface of the fin structure 110, which is greater than the fifth height $H_5$ of the air gaps 145 in FIG. 2G. Therefore, the top surfaces of the remaining gate structures 140" are higher than the interfaces between the mask layer 146 and the air gaps 145 in FIG. 4.

Figure 5:
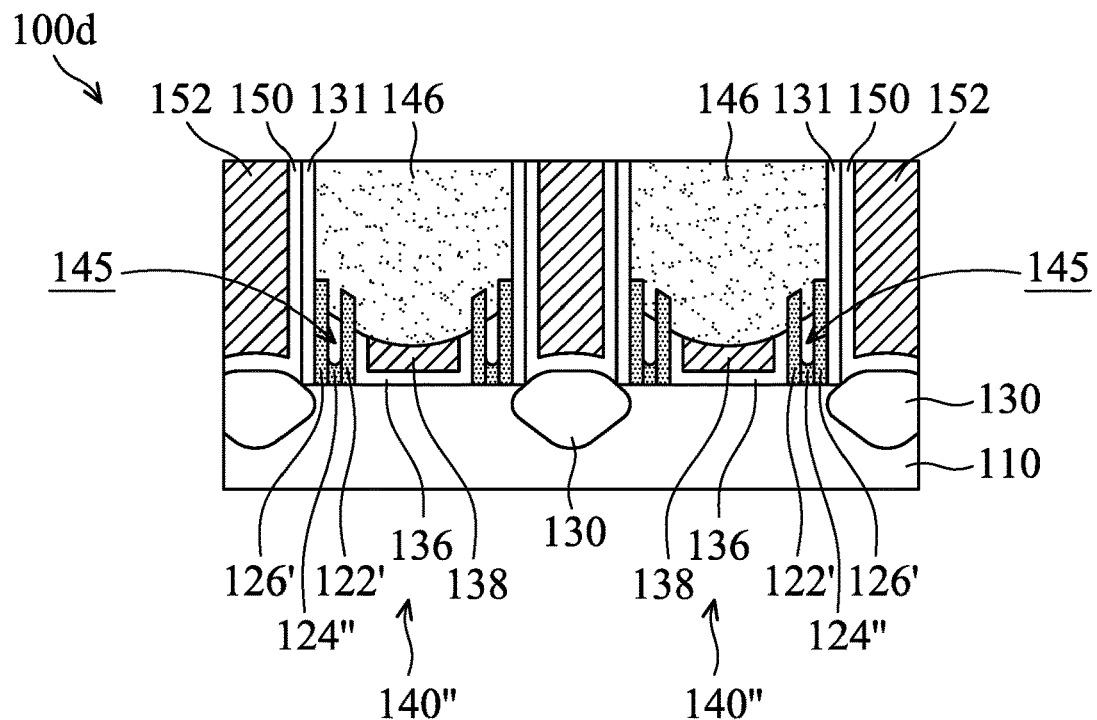
FIG. 5 is a cross-sectional representation of a modified FinFET device structure, in accordance with some embodiments of the disclosure.

FIG. 5 is a cross-sectional representation of a modified FinFET device structure 100d, in accordance with some embodiments of the disclosure. The FinFET device structure 100d is similar to the FinFET device structure 100a of FIG. 2G, and the difference between FIG. 5 and FIG. 2G is that the second spacers 124' are partially left after the etching process of the second spacers 124' is performed.

As a result, the fin structures 110 are covered by remaining portions 124" of the second spacers 124', and the mask layer 146 is separated from the remaining portions 124" of the second spacers 124' by the air gaps 145.

Figure 6:
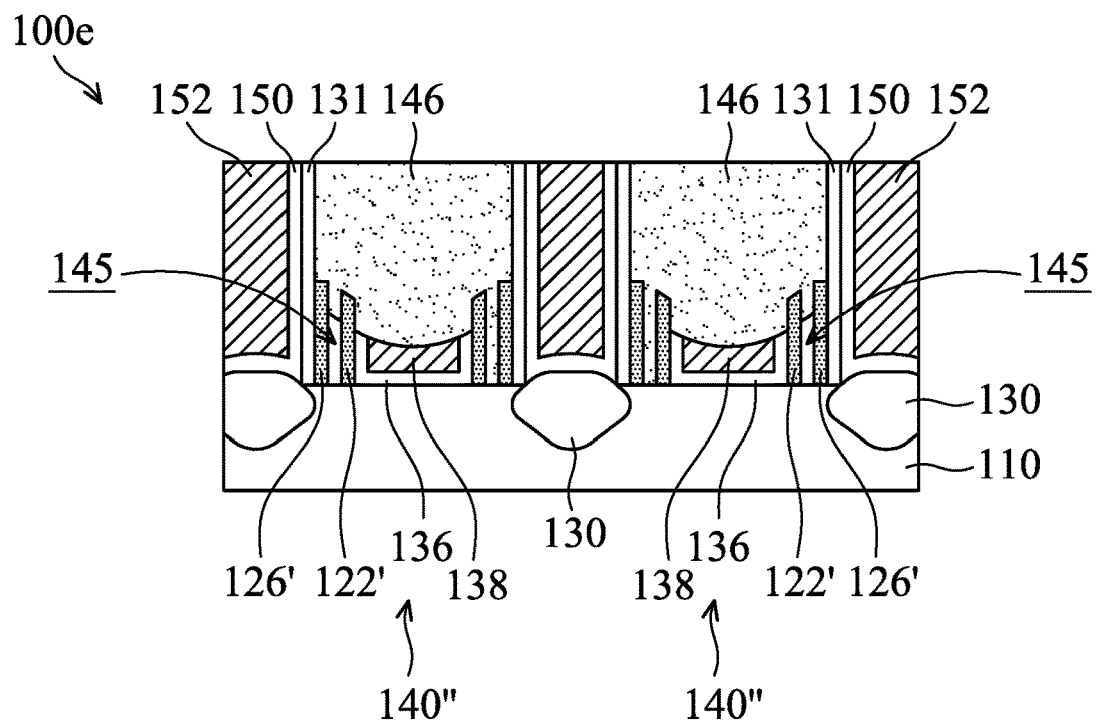
FIG. 6 is a cross-sectional representation of a modified FinFET device structure, in accordance with some embodiments of the disclosure.

FIG. 6 is a cross-sectional representation of a modified FinFET device structure 100e, in accordance with some embodiments of the disclosure. The FinFET device structure 100e is similar to the FinFET device structure 100a of FIG. 2G, and the difference between FIG. 6 and FIG. 2G is that some of the gaps 144 between the first spacers 122' and the third spacers 126' are entirely filled by the mask layer 146.

For example, the mask layer 146 is separated from the fin structure 110 by one of the air gaps 145 at the left side of the left remaining gate structure 140", while the mask layer 146 is in direct contact with the fin structure 110 at the right side of the left remaining gate structure 140".

Figure 7:
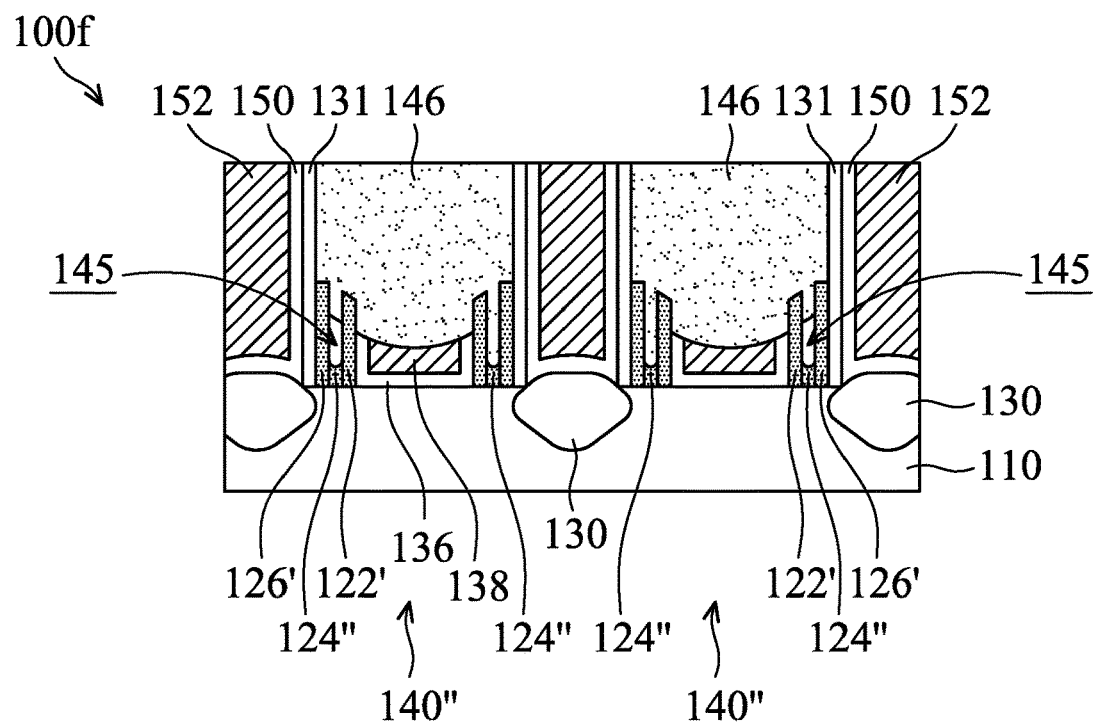
FIG. 7 is a cross-sectional representation of a modified FinFET device structure, in accordance with some embodiments of the disclosure.

FIG. 7 is a cross-sectional representation of a modified FinFET device structure 100f, in accordance with some embodiments of the disclosure. The FinFET device structure 100f is similar to the FinFET device structure 100d of FIG. 5, and the difference between FIG. 7 and FIG. 5 is that some of the gaps 144 between the first spacers 122' and the third spacers 126' are entirely filled by the mask layer 146.

For example, the mask layer 146 is separated from the remaining portions 124" of the second spacers 124' by one of the air gaps 145 at the left side of the left remaining gate structure 140", while the mask layer 146 is in direct contact with the remaining portions 124" of the second spacers 124' at the right side of the left remaining gate structure 140".

Figure 8:
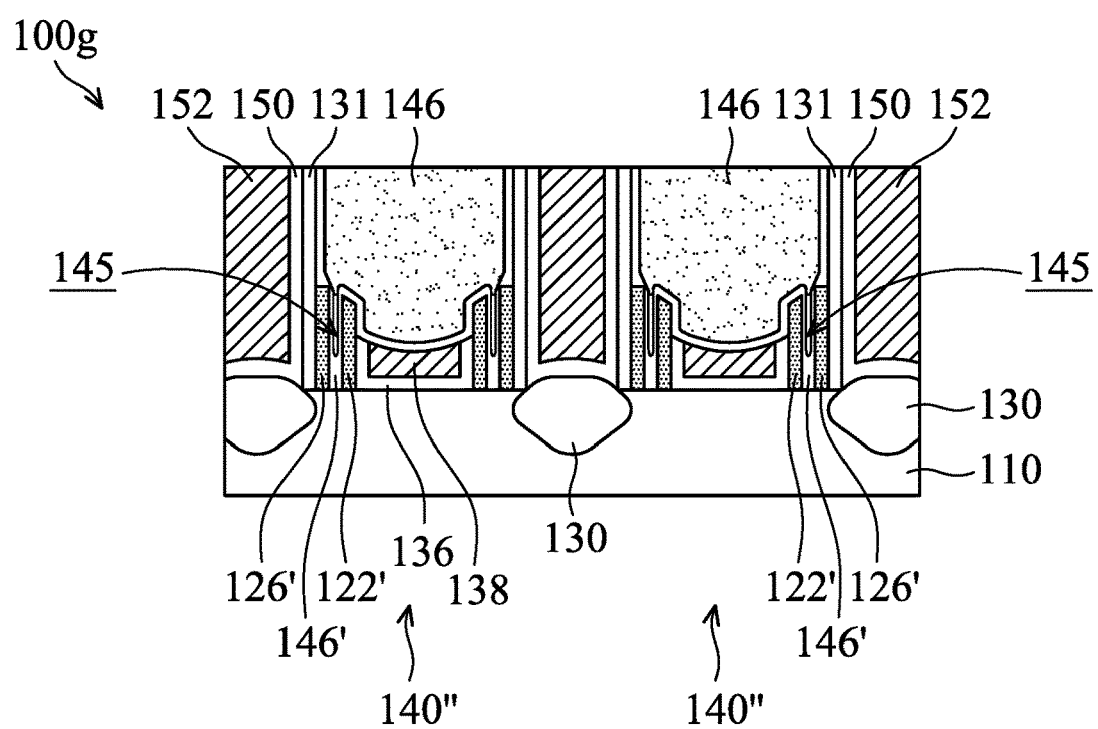
FIG. 8 is a cross-sectional representation of a modified FinFET device structure, in accordance with some embodiments of the disclosure.

FIG. 8 is a cross-sectional representation of a modified FinFET device structure 100g, in accordance with some embodiments of the disclosure. The FinFET device structure 100g is similar to the FinFET device structure 100a of FIG. 2G, and the difference between FIG. 8 and FIG. 2G is that the mask layer 146 is replaced with a first mask layer 146' and a second mask layer 146" in FIG. 8.

More specifically, the first mask layer 146' is conformally formed covering the first spacers 122', the third spacers 126', the bottom surface and sidewalls of the gaps 144 between the first spacers 122' and the third spacers 126', and the sidewalls of the CESL 131. After the first mask layer 146' is formed, the second mask layer 146" is formed over the first mask layer 146'. As a result, the air gaps 145 are enclosed by the first mask layer 146' and the second mask layer 146".

In some embodiments, the first mask layer 146' is made of silicon, nitride, silicon nitride or another applicable material. In some embodiments, the first mask layer 146 is formed by a deposition process, such as an atomic layer deposition (ALD) process or another applicable process.

In some embodiments, the second mask layer 146" is made of oxide, silicon oxide or another applicable material. In some embodiments, the second mask layer 146" is formed by a deposition process, such as a chemical vapor deposition (CVD) process or another applicable process.

As described previously, the first spacers 122' are formed over the sidewalls of the remaining gate structures 140" and the second spacers 124' are formed over the sidewalls of the first spacers 122'. The second spacers 124' are removed by etching such that gaps 144 are formed between the first spacers 122' and the contact etch stop layer (CESL) 131 adjacent to the remaining gate structures 140". After the second spacers 124' are removed, the mask layer 146 is formed over the remaining gate structures 140" and the first spacers 122'. The mask layer 146 extends into upper portions of the gaps 144 such that lower portions of the gaps 144 forms air gaps 145. Therefore, the remaining gate structures 140" may be protected by the mask layer 146 during the subsequent processes. Moreover, the air gaps 145 covered by the mask layer 146 may be used to reduce the capacitance between the remaining gate structures 140" and the contacts 152, which are electrically connected to the source/drain (S/D) structures 130.

Embodiments of a FinFET device structure and method for forming the same are provided. The method for forming the FinFET device structure includes forming a first spacer and a second spacer over a sidewall of the gate structure, and forming a gap by etching the second spacer. After the gap is formed, a mask layer is formed covering the gate structure, the first spacer and the gap, such that an air gap is formed adjacent to the gate structure. Since the dielectric constant of the air gap is lower than that of the first spacer, the capacitance between the gate structure and the adjacent contact may be reduced, and the performance of the FinFET device structure may be increased.

In some embodiments, a method for forming a FinFET device structure is provided. The method for forming a FinFET device structure includes forming a fin structure over a substrate and forming a gate structure across the fin structure. The method for forming a FinFET device structure also includes forming a first spacer over a sidewall of the gate structure and forming a second spacer over the first spacer. The method for forming a FinFET device structure further includes etching the second spacer to form a gap and forming a mask layer over the gate structure and the first spacer after the gap is formed. In addition, the mask layer extends into the gap such that the mask layer and the fin structure are separated by an air gap in the gap.

In some embodiments, a method for forming a FinFET device structure is provided. The method for forming a FinFET device structure includes forming a fin structure over a substrate and forming a gate structure across the fin structure. The method for forming a FinFET device structure also includes forming a first spacer over a sidewall of the gate structure and forming a second spacer over a sidewall of the first spacer. The method for forming a FinFET device structure further includes removing a first portion of the gate structure to form a first opening and partially removing the first spacer and the second spacer through the first opening. In addition, the method for forming a FinFET device structure includes removing a second portion of the gate structure to form a second opening below the first opening and etching the second spacer to form a gap after the second opening is formed. The method for forming a FinFET device structure also includes forming a mask layer covering the gate structure, the first spacer and the gap such that an air gap is formed in the gap.

In some embodiments, a FinFET device structure is provided. The FinFET device structure includes a fin structure formed over a substrate and a gate structure formed over the fin structure. The FinFET device structure also includes a first spacer formed on a sidewall of the gate structure and a contact formed over the fin structure and adjacent to the gate structure. The contact and the first spacer have an air gap therebetween. The FinFET device structure further includes a mask layer formed over the gate structure, the first spacer and the air gap. The top surface of the first spacer is higher than the interface between the mask layer and the air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a fin structure formed over a substrate;
   a gate structure formed across the fin structure, wherein the gate structure comprises a gate dielectric layer;
   a first spacer formed on a sidewall of the gate structure;
   a contact formed over the fin structure and adjacent to the gate structure, wherein the contact and the first spacer have an air gap therebetween; and
   a mask layer formed over and in direct contact with the gate dielectric layer of the gate structure, the first spacer and the air gap, wherein a top surface of the first spacer is higher than an interface between the mask layer and the air gap, and the mask layer is a single layer, wherein the first spacer is in direct contact with the gate dielectric layer of the gate structure and the air gap.

2. The fin field effect transistor (FinFET) device structure as claimed in claim 1, further comprising:
   a source/drain (S/D) structure formed between the fin structure and the contact, wherein the S/D structure is electrically connected to the contact; and
   a contact etch stop layer (CESL) formed over the S/D structure and between the mask layer and the contact, wherein the CESL is separated from the first spacer by the air gap.

3. The fin field effect transistor (FinFET) device structure as claimed in claim 2, further comprising:
   a second spacer formed between the first spacer and the CESL, wherein the second spacer is separated from the mask layer by the air gap.

4. The fin field effect transistor (FinFET) device structure as claimed in claim 2, further comprising:
   a third spacer formed between the CESL and the first spacer, wherein a top surface of the third spacer is covered by the mask layer, the third spacer is separated from the first spacer by the air gap, and a material of the first spacer is the same as a material of the third spacer.

5. The fin field effect transistor (FinFET) device structure as claimed in claim 1, wherein the mask layer comprises a first mask layer and a second mask layer over the first mask layer, and the top surface of the first spacer and a top surface of the gate structure are covered by the first mask layer, and wherein the air gap is enclosed by the first mask layer and the second mask layer, and the first mask layer and the second mask layer are made of different materials.

6. A fin field effect transistor (FinFET) device structure, comprising:
   a fin structure formed over a substrate;
   a gate structure formed across the fin structure;
   a first spacer formed on a sidewall of the gate structure;
   a second spacer formed over the fin structure and adjacent to the first spacer, wherein the first spacer and the second spacer have an air gap therebetween;
   a mask layer formed over the gate structure, the first spacer, the second spacer and the air gap, wherein the mask layer and the fin structure are separated by the air gap; and
   a contact formed over the fin structure and adjacent to the second spacer and the mask layer, wherein a topmost surface of the mask layer is level with a topmost surface of the contact.

7. The fin field effect transistor (FinFET) device structure as claimed in claim 6, wherein the first spacer is closer to the gate structure than the second spacer.

8. The fin field effect transistor (FinFET) device structure as claimed in claim 7, wherein a top surface of the second spacer is higher than a top surface of the first spacer.

9. The fin field effect transistor (FinFET) device structure as claimed in claim 6, wherein a top surface of the first spacer is lower than a top surface of the mask layer.

10. The fin field effect transistor (FinFET) device structure as claimed in claim 9, wherein a top surface of the gate structure is lower than the top surface of the first spacer.

11. The fin field effect transistor (FinFET) device structure as claimed in claim 6, wherein an interface between the mask layer and the air gap is higher than a top surface of the gate structure and lower than a top surface of the second spacer.

12. A fin field effect transistor (FinFET) device structure, comprising:
    a fin structure formed over a substrate;
    a gate structure formed across the fin structure;
    a first spacer formed on a sidewall of the gate structure;
    a contact formed over the fin structure and adjacent to the gate structure, wherein the contact and the first spacer have an air gap therebetween, and a top surface of the fin structure is exposed to the air gap; and
    a mask layer formed over the gate structure, the first spacer and the air gap, wherein a top portion of the first spacer is embedded in the mask layer.

13. The fin field effect transistor (FinFET) device structure as claimed in claim 12, further comprising:
    a second spacer formed between the first spacer and the contact, wherein a top surface of the second spacer is covered by the mask layer, and the second spacer is separated from the first spacer by the air gap.

14. The fin field effect transistor (FinFET) device structure as claimed in claim 13, wherein a top portion of the second spacer is embedded in the mask layer.

15. The fin field effect transistor (FinFET) device structure as claimed in claim 13, wherein the mask layer has a first thickness over the gate structure and a second thickness over the first spacer, and the first thickness is greater than the second thickness.

16. The fin field effect transistor (FinFET) device structure as claimed in claim 15, wherein the mask layer has a third thickness over the second spacer, wherein the second thickness is greater than the third thickness.

17. The fin field effect transistor (FinFET) device structure as claimed in claim 16, wherein the mask layer has a fourth thickness over the air gap, and the fourth thickness is greater than the second thickness and the third thickness and smaller than the first thickness.

18. The fin field effect transistor (FinFET) device structure as claimed in claim 1, wherein a topmost surface of the mask layer is level with a topmost surface of the contact.

19. The fin field effect transistor (FinFET) device structure as claimed in claim 6, wherein a sidewall of the second spacer is substantially aligned with a sidewall of the mask layer.

20. The fin field effect transistor (FinFET) device structure as claimed in claim 1, wherein a topmost surface of the gate structure is lower than the top surface of the first spacer.

\* \* \* \* \*